United States Patent
Matsuda et al.

(10) Patent No.: US 8,513,139 B2
(45) Date of Patent: Aug. 20, 2013

(54) ETCHING AGENT, ETCHING METHOD AND LIQUID FOR PREPARING ETCHING AGENT

(75) Inventors: Osamu Matsuda, Saitama (JP); Nobuyuki Kikuchi, Saitama (JP); Ichiro Hayashida, Tokyo (JP); Satoshi Shirahata, Saitama (JP)

(73) Assignee: Wako Pure Chemical Industries, Ltd., Chuo-Ku, Tokyo (JP)

( * ) Notice: Subject to any disclaimer, the term of this patent is extended or adjusted under 35 U.S.C. 154(b) by 248 days.

(21) Appl. No.: 12/808,903

(22) PCT Filed: Dec. 19, 2008

(86) PCT No.: PCT/JP2008/073246
§ 371 (c)(1), (2), (4) Date: Jun. 17, 2010

(87) PCT Pub. No.: WO2009/081884
PCT Pub. Date: Jul. 2, 2009

(65) Prior Publication Data
US 2011/0230053 A1    Sep. 22, 2011

(30) Foreign Application Priority Data
Dec. 21, 2007 (JP) ................ 2007-329530

(51) Int. Cl.
H01L 21/302 (2006.01)
H01L 21/461 (2006.01)

(52) U.S. Cl.
USPC .......................... 438/745; 438/754

(58) Field of Classification Search
None
See application file for complete search history.

(56) References Cited

U.S. PATENT DOCUMENTS

| | | | |
|---|---|---|---|
| 2003/0083214 A1* | 5/2003 | Kakizawa et al. | 510/175 |
| 2006/0270573 A1* | 11/2006 | Ikemoto et al. | 510/175 |
| 2008/0011321 A1* | 1/2008 | Ikemoto et al. | 134/1.3 |

FOREIGN PATENT DOCUMENTS

| | | | |
|---|---|---|---|
| JP | 2000-311891 A | 11/2000 | |
| JP | 2002-155382 A | 5/2002 | |
| JP | 2003-328159 A | 11/2003 | |
| JP | 2004-31791 A | 1/2004 | |
| JP | 2005-146358 A | 6/2005 | |
| JP | 2005-163108 A | 6/2005 | |
| JP | 2005-320608 A | 11/2005 | |
| JP | 2007-100130 A | 4/2007 | |

OTHER PUBLICATIONS

Extended European Search Report dated Nov. 4, 2011, issued in corresponding European Patent Application No. 08864783.9 (10 pages).
Chinese Office Action dated Aug. 25, 2011, issued in corresponding Chinese Patent Application No. 200880121508.X, with English translation (8 pages).
Chinese Office Action dated May 18, 2012, issued in corresponding Chinese Patent Application No. 200880121508.X, with English translation (7 pages).
International Search Report of PCT/JP2008/073246, mailing date Mar. 24, 2009.
Chinese Office Action dated Dec. 17, 2012, issued in corresponding Chinese Patent Application No. 200880121508.X, with English translation.
English translation only of the First Chinese Office Action dated Aug. 25, 2011, issued in corresponding Chinese Patent Application No. 200880121508.X.
English translation only of the Second Chinese Office Action dated May 18, 2012, issued in corresponding Chinese Patent Application No. 200880121508.X.
Claim Amendment filed on Jan. 9, 2012, against the First Chinese Office Action issued in corresponding Chinese Patent Application No. 200880121508.X (English Only).
Claim Amendment filed on Aug. 2, 2012, against the Second Chinese Office Action issued in corresponding Chinese Patent Application No. 200880121508.X (English Only).
Japanese Office Action dated Apr. 2, 2013, issued in corresponding Japanese Patent Application No. 2009-547087.
Japanese Office Action dated Apr. 2, 2013, issued in corresponding Japanese Patent Application No. 2012-003786.

* cited by examiner

*Primary Examiner* — Duy Deo
(74) *Attorney, Agent, or Firm* — Westerman, Hattori, Daniels & Adrian, LLP

(57) ABSTRACT

The present invention is directed to provide an etching agent for a semiconductor substrate, which is capable of etching a titanium (Ti)-based metal film or a tungsten (W)-based metal film on a semiconductor substrate and an etching method using relevant etching agent, and relates to a liquid for preparing the etching agent for a semiconductor substrate composed of a solution comprising (A) hydrogen peroxide, (B) a phosphonic acid chelating agent having a hydroxyl group, (C) a basic compound, and (D-1) a copper anticorrosive and/or (D-2) 0.01 to 3% by weight of two or more kinds of anion species other than phosphonic acid chelating agents having a hydroxyl group, in which anion species have no oxidizing power, an etching method characterized by etching a titanium (Ti)-based metal film or a tungsten (W)-based metal film on a semiconductor substrate using relevant etching agent for a semiconductor substrate, further, a solution comprising (B) a phosphonic acid chelating agent having a hydroxyl group, (C) a basic compound, and (D-1) a copper anticorrosive and/or (D-2) anion species other than phosphonic acid chelating agents having a hydroxyl group, in which anion species have no oxidizing power.

27 Claims, No Drawings

ETCHING AGENT, ETCHING METHOD AND LIQUID FOR PREPARING ETCHING AGENT

TECHNICAL FIELD

The present invention relates to processing of semiconductor substrate on which a titanium (Ti)-based metal film was formed, in particular, copper (Cu) wiring was performed, and mainly an etching agent for a Ti-based metal film such as Ti film, titanium-tungsten (TiW) alloy film, and an etching method. In addition, the present invention relates to processing of a semiconductor substrate on which a metal bump or a metal wiring having lower ionization tendency than that of tungsten has been formed, in particular, processing of a semiconductor substrate on which a tungsten (W)-based metal film was performed, and mainly an etching agent for a W-based metal film such as W film, TiW alloy film, and an etching method.

BACKGROUND OF THE INVENTION

Heretofore, as an etching liquid for a Ti-based metal film such as Ti film and TiW alloy film, for example, hydrogen peroxide etching liquid, acidic etching liquid such as, for example, hydrofluoric acid-hydrogen peroxide mixed liquid, phosphoric acid-hydrogen peroxide mixed liquid, are known.

However, the hydrogen peroxide solution not only has a problem that when a metal such as, for example, copper, silver, gold is contained, decomposition of hydrogen peroxide is promoted and lifetime of the etching liquid is shortened, but also has such problems that it is difficult to control a concentration of hydrogen peroxide in the etching liquid and that etching rate is slow, and the like.

In addition, for example, the hydrofluoric acid hydrogen peroxide mixed liquid has such problems that, for example, etching rate is slow and that corrosion of underlying metal or metal on a substrate is significant, and the like, and the phosphoric acid-hydrogen peroxide mixed liquid has such problems, for example, that etching residue is generated and that corrosion of underlying metal or metal on a substrate is significant, and the like.

Under such circumstance, as an etching method for a Ti-based metal film such as Ti film, TiW alloy film without generating etching residue, an etching method for a Ti-based film on a semiconductor substrate using a solution containing hydrogen peroxide and a chelating agent has been proposed (see, JP-A-2002-155382).

However, depending on a kind of underlying metal or metal on a semiconductor substrate, such problems occur that etching selectivity is poor because, for example, corrosion of other metals occurs, and that lifetime of the etching liquid becomes, shortened and etching rate becomes slow because, for example, decomposition of hydrogen peroxide is promoted, and the like.

In addition, in order to carry out etching for Ti or TiW alloy without discoloration of solder, for example, an etching liquid containing hydrogen peroxide, a phosphonic-acid-based compound, and the like has been disclosed (see, JP-A-2003-328159). However, as a phosphonic-acid-based compound, no compound other than nitrogen-containing phosphonic acid has been disclosed, and since such phosphonic-acid-based compound has such a problem that there is fear of stability when added to the solution containing hydrogen peroxide, for example, because the solution thereof is strongly colored and too many metal impurities are contained as an etching agent for a semiconductor substrate.

Under such circumstance, in processing of a semiconductor substrate provided with Cu wiring and a semiconductor substrate useful for forming lead (Pb)-free solder bump, developments of an etching method improving an etching selectivity of a Ti-based metal film and an etching liquid to be used for selective etching of a Ti-based metal film have been desired.

On the other hand, heretofore, since a coating used a metal having lower ionization tendency such as gold, silver has not only superior physical properties such as good electric conductivity, superior thermocompression bonding ability but also superior chemical properties such as oxidation resistance, chemical resistance, the coating has been suitably used for forming bump, wiring, and the like on a semiconductor substrate (see, JP-A-2007-100130, etc.).

In addition, on the other hand, for etching the tungsten (W) and/or titanium-tungsten (TiW) alloy in the presence of such metal having good electric conductivity, for example, an etching liquid characterized by containing at least an aqueous hydrogen peroxide solution and an alkali component and having pH of 7 or less, and the like have been known (see, JP-A-2004-31791, etc.). However, recently, since precision in wiring, and the like is desired, there is a problem that such etching liquid is not sufficient to inhibit side-etching of W, TiW alloy, and the like.

DISCLOSURE OF INVENTION

Problem to be Solved by the Invention

Considering the situation exemplified above, a problem to be solved by the present invention is to provide an etching method for a Ti-based metal film on a semiconductor substrate, in particular, a selective etching method for a Ti-based metal film on a semiconductor substrate as well as an etching liquid to be used therefor.

In addition, the present inventors tried to apply the etching agent for a Ti-based metal film on a semiconductor substrate, on which Cu wiring of the present invention completed previously had been formed, as an etching agent for a W-based metal film on a semiconductor substrate, on which a metal bump or a metal wiring having lower ionization tendency than that of tungsten such as gold bump had been formed, and found that the W-based metal film directly beneath relevant metal bump or metal wiring was etched, that is, side-etching occurred, and also that this side-etching was caused by bimetallic corrosion (Galvanic corrosion) between tungsten and a metal having lower ionization tendency than that of tungsten (low ionization tendency metal) such as gold, silver. Consequently, the present inventors studied to improve the etching agent for a Ti-based metal film, and developed an etching agent which is capable of inhibiting the bimetallic corrosion (Galvanic corrosion), and finally succeeded to provide an etching agent which can be applied to a semiconductor substrate provided with a W-based metal film on which a metal bump or a metal wiring having low ionization tendency such as gold, silver has been formed.

Means to Solving the Problem

The present invention is the invention relating to an etching agent for a semiconductor substrate composed of a solution comprising (A) hydrogen peroxide, (B) a phosphonic acid chelating agent having a hydroxyl group and (C) a basic compound, and (D-1) a copper anticorrosive agent and/or (D-2) 0.01 to 3% by weight of two or more kinds of anion species other than phosphonic acid chelating agents having a hydroxyl group, in which anion species have no oxidizing power.

In addition, the present invention is the invention relating to an etching method characterized by selectively etching a Ti-based metal film on a semiconductor substrate using relevant etching agent for a semiconductor substrate.

Further, the present invention is the invention relating to an etching method characterized by selectively etching a W-based metal film on a semiconductor substrate using relevant etching agent for a semiconductor substrate.

Still further, the present invention is the invention relating to a liquid for preparing an etching agent for a semiconductor substrate composed of a solution comprising (B) a phosphonic acid chelating agent having a hydroxyl group and (C) a basic compound, and (D-1) a copper anticorrosive and/or (D-2) two or more kinds of anion species other than phosphonic acid chelating agents having a hydroxyl group, in which anion species have no oxidizing power.

Effect of the Invention

By selectively etching a Ti-based metal film on a semiconductor substrate, in particular, a Ti-based metal film on a semiconductor substrate provided with Cu wiring on the upper part thereof, using the etching agent for a semiconductor substrate composed of a solution comprising (A) hydrogen peroxide, (B) a phosphonic acid chelating agent having a hydroxyl group, (c-1) an inorganic alkali among (C) basic compounds, and (D-1) a copper anticorrosive among the etching agents of the present invention, such effects as, for example, corrosion of an underlying metal or a metal on a substrate can be inhibited; lifetime of the etching agent can be prolonged because amount of metal dissolved into the etching agent is reduced; etching can be carried out without residue due to improved etching selectivity for a Ti-based metal film; and the like can be exhibited as compared with the conventional methods.

In addition, when a Ti-based metal film on a semiconductor substrate, in particular, a Ti-based metal film on a substrate provided with Cu wiring is selectively etched, by using a solution which is prepared by mixing the liquid for preparing etching agent for a semiconductor substrate of the present invention and hydrogen peroxide at the point of use, the following effects can be exhibited: for example, performance deterioration of the etching agent caused by decomposition of hydrogen peroxide can be further inhibited; instability of hydrogen peroxide due to coexistence of alkali can be avoided; and etching rate of a Ti-based metal film can be suitably adjusted by mixing ratio of relevant liquid for preparing etching agent and hydrogen peroxide; and the like.

By etching a W-based metal film on a semiconductor substrate provided with a metal bump or a metal wiring having lower ionization tendency than that of tungsten (low ionization tendency metal) such as, for example, gold, silver, palladium, tin, or alloy thereof, using the etching agent for a semiconductor substrate composed of a solution comprising (A) hydrogen peroxide, (B) a phosphonic acid chelating agent having a hydroxyl group, (C) a basic compound, and (D-2) 0.01 to 3% by weight of two or more kinds of anion species other than phosphonic acid chelating agents having a hydroxyl group, in which anion species have no oxidizing power, among the etching agents of the present invention, the following effects can be exhibited: bimetallic corrosion (Galvanic corrosion) by a W-based metal and the above-described metal having lower ionization tendency than that of tungsten can be inhibited; and consequently side-etching by relevant corrosion can be inhibited; and the like.

BEST MODE FOR CARRYING-OUT OF THE INVENTION

In the present invention, Ti-based metal film means a film of Ti-based metal formed on a substrate by Ti or Ti alloy such as TiW (hereinafter, optionally abbreviated as "Ti-based film").

In the present invention, W-based metal film means a film of W-based metal formed on a substrate by W or W alloy such as TiW (hereinafter, optionally abbreviated as "W-based film").

(A) Hydrogen peroxide relevant to the etching agent of the present invention is used for the purpose to oxidize Ti film, W film, TiW alloy film, and the like, and to make dissolution reaction by a basic compound (alkali compound) such as inorganic alkalis, organic amines, easy.

In the etching agent for a Ti-based metal film on a semiconductor substrate on which a copper wiring has been formed (hereinafter, optionally abbreviated as the etching agent relevant to the present invention <1>), among the etching agents of the present invention, concentration of (A) hydrogen peroxide to be used is usually 10 to 35% by weight, preferably 15 to 30% by weight, more preferably 15 to 26% by weight, and still more preferably 20 to 26% by weight, as a concentration in said etching agent.

In the etching agent for a W-based metal film on a semiconductor substrate on which a metal bump or a metal wiring having lower ionization tendency than that of tungsten has been formed (hereinafter, optionally abbreviated as the etching agent relevant to the present invention <2>), among the etching agents of the present invention, concentration of (A) hydrogen peroxide to be used is usually 10 to 35% by weight, preferably 15 to 35% by weight, more preferably 20 to 35% by weight, and still more preferably 24 to 32% by weight, as a concentration in said etching agent.

As the above-described (A) hydrogen peroxide, a commercially available one may be used as appropriate, and specifically, for example, a commercially available hydrogen peroxide may be used after diluting with distilled water, purified water, ion-exchanged water, ultrapure water, or the like to a proper concentration.

As the (B) phosphonic acid chelating agent having a hydroxyl group relevant to the present invention, such chelating agent, which can maintain oxidizing power by preventing decomposition of hydrogen peroxide, and which has an action to dissolve Ti film, W film or TiW alloy film by coordinating to Ti or W together with hydrogen peroxide to form an water-soluble complex, is used.

Relevant (B) phosphonic acid chelating agent having a hydroxyl group includes, for example, alkane-polyphosphonic acids having a hydroxyl group such as 1-hydroxyethylidene-1,1'-diphosphonic acid (HEDPO), 1-hydroxypropylidene-1,1'-diphosphonic acid, 1-hydroxybutylidene-1,1'-diphosphonic acid, and among them, 1-hydroxyethylidene-1,1'-diphosphonic acid (HEDPO) is particularly preferable. These phosphonic acid chelating agents exhibit such effects that can inhibit generation of etching residue and insoluble matter on etching substrates due to good solubilities of chelate in the presence of hydrogen peroxide, oxide of Ti-based or W-based metal and Cu.

In the etching agent relevant to the present invention <1>, use concentration of the (B) phosphonic acid chelating agent having a hydroxyl group is usually 0.1 to 3% by weight, preferably 0.2 to 2% by weight, more preferably 0.3 to 1% by weight, still more preferably 0.4 to 0.8% by weight, as a concentration in said etching agent.

In the etching agent relevant to the present invention <2>, use concentration of the (B) phosphonic acid chelating agent having a hydroxyl group is usually 0.1 to 3% by weight, preferably 0.1 to 2% by weight, more preferably 0.15 to 1% by weight, still more preferably 0.2 to 0.6% by weight, as a concentration in said etching agent.

In this connection, as these (B) phosphonic acid chelating agents having a hydroxyl group, commercially available one can be sufficiently used.

The (C) basic compound relevant to the etching agent of the present invention means the one selected from (c-1) inorganic alkalis and (c-2) organic amines, and in the etching agent relevant to the present invention <1>, relevant basic compound is required to be an inorganic alkali. Relevant inorganic alkali is the one to be used to maintain pH of the solution in a specified range as well as to dissolve oxides of Ti film, W film, TiW alloy film, or the like, which are oxidized by hydrogen peroxide. Specific example of the (c-1) inorganic alkali in the etching agent relevant to the present invention <1> includes, for example, ammonia, hydroxides of alkali metal such as, for example, potassium hydroxide, sodium hydroxide. Among them, hydroxides of alkali metal are preferable, and sodium hydroxide is more preferable.

On the other hand, specific example of the c-1) inorganic alkali in the etching agent relevant to the present invention <2> includes, for example, ammonia, hydroxides of alkali metal such as, for example, potassium hydroxide, sodium hydroxide. Among them, hydroxides of alkali metal are preferable, and sodium hydroxide is more preferable.

The (c-2) organic amine relevant to the etching agent of the present invention is used only for the etching agent relevant to the present invention <2>, and is the one to be used to maintain pH of the solution in a specified range as well as to dissolve oxides of W film, TiW alloy film, or the like, which are oxidized by hydrogen peroxide, similarly to the above-described (c-1) inorganic alkali. Specific example of relevant organic amine includes, for example, tetramethylammonium hydroxide (TMAH), choline hydroxide, and the like. Among them, tetramethylammonium hydroxide (TMAH) is preferable.

In the etching agent relevant to the present invention <2>, the (C) basic compound may be at least one or more kinds of basic compound selected from the above-described (c-1) inorganic alkalis and (c-2) organic amines. Among them, at least one or more kinds of basic compound selected from sodium hydroxide and tetramethylammonium hydroxide (TMAH) are preferable, and particularly single use of either sodium hydroxide or tetramethylammonium hydroxide (TMAH) is more preferable. Sodium hydroxide and tetramethylammonium hydroxide (TMAH) are preferable, because said compounds generate ions having small molar electric conductivity (large hydrated radius) such as sodium ion or quaternary ammonium ion in an aqueous solution, and contact of relevant ions with a metal having lower ionization tendency than that of tungsten (low ionization tendency metal) inhibit handover of electron to hydrogen ion on the surface of relevant metal, and consequently dissolution of tungsten (Galvanic corrosion) can be easily inhibited.

In the etching agent relevant to the present invention <1>, use concentration of the (c-1) inorganic alkali to be used varies depending on kind of inorganic alkali, kind and addition amount of the (B) phosphonic acid chelating agent having a hydroxyl group and (D-1) a copper anticorrosive as described later, but is usually 0.2 to 12% by weight, preferably 0.5 to 10% by weight, and more preferably 0.8 to 4% by weight as a concentration in said etching agent.

In the etching agent relevant to the present invention <2>, use concentration of the (c-1) inorganic alkali varies depending on kind of the inorganic alkali to be used, kind and addition amount of the (B) phosphonic acid chelating agent having a hydroxyl group and (D-2) two or more kinds of anion species other than phosphonic acid chelating agents having a hydroxyl group, in which anion species have no oxidizing power, pH of the solution, and the like, but is usually 0.1 to 5% by weight, preferably 0.2 to 4% by weight, and more preferably 0.2 to 2% by weight as a concentration in said etching agent.

The (D-1) copper anticorrosive in the etching agent relevant to the present invention <1> is preferably used for the etching agent relevant to the present invention <1>, among the etching agents of the present invention. Relevant copper anticorrosive may be the one which is usually used in this field, and includes, for example, epihalohydrin-modified polyamide, benzotriazole compound, hydroxycarboxylic acid, nitrogen-containing cyclic compound, and the like.

The epihalohydrin-modified polyamide exemplified as the (D-1) copper anticorrosive includes, for example, a compound in which a hydrogen atom of —NH— group existing in the main chain of the polycondensate obtained by a reaction of diaminoalkyl amine and dicarboxylic acid is partly or fully substituted by either one or both of the group represented by the general formula [1]:

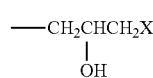

(wherein, X represents a halogen atom) and a glycidyl group, and the like.

Relevant polycondensate includes, for example, a compound having a repeating unit represented by the general formula [2]:

{wherein, $R^1$ represents an alkylene group having 1 to 6 carbon atoms, an arylene group, or a group represented by the general formula [3]:

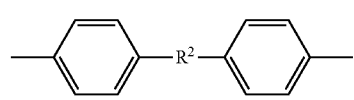

(wherein, $R^2$ represents an alkylene group having 1 to 6 carbon atoms), $R^3$ and $R^4$ are each independently represents an alkylene group having 1 to 6 carbon atoms}, and the like.

Specific example of the epihalohydrin-modified polyamide exemplified as the (D-1) copper anticorrosive includes, for example, a compound composed of either one or both of a repeating unit represented by the general formula [4]:

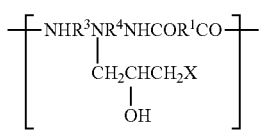

(wherein, $R^1$, $R^3$, $R^4$ and X are same as above) and a repeating unit represented by the general formula [5]:

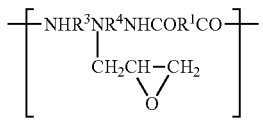

(wherein, $R^1$, $R^3$, $R^4$ and X are same as above), or a combination of these units and the repeating units represented the above-described general formula [2], and the like. In this connection, since the repeating unit represented by the above-described general formula [4] is optionally tautomerized, for example, by heat treatment, or the like to a structure of a repeating unit represented by the general formula [6]:

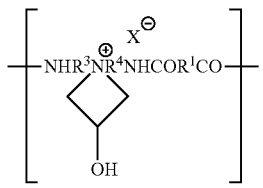

(wherein, $R^1$, $R^3$, $R^4$ and X are same as above), even when the repeating unit is simply described as a repeating unit represented by the general formula [4], the repeating unit includes the case where this repeating unit and the repeating unit represented by the general formula [6] coexist.

In the general formulae [1] and [4], the halogen atom represented by X includes, for example, a fluorine atom, a chlorine atom, a bromine atom, an iodine atom, and the like, and among them, a chlorine atom is preferable.

In the general formulae [2] and [4] to [5], the alkylene group having 1 to 6 carbon atoms represented by $R^1$, $R^3$ and $R^4$ may be any of linear, branched or cyclic group, and includes usually the one having 1 to 6 carbon atoms. Specifically, the group includes linear alkylene groups such as, for example, a methylene group, an ethylene group, a trimethylene group, a tetramethylene group, a pentamethylene group, a hexamethylene group; branched alkylene groups such as, for example, a propylene group, a methylmethylene group, a dimethylmethylene group, an ethylmethylene group, a methylethylene group, a methyltetramethylene group, an ethyltetramethylene group; cyclic alkylene groups such as, for example, a cyclopropylene group, a cyclopentylene group, a cyclohexylene group, and among them, a tetramethylene group is preferable.

The arylene group represented by $R^1$ includes usually the one having 6 to 10 carbon atoms, for example, a phenylene group, a naphthylene group, and the like.

In the general formula [3], the alkylene group having 1 to 6 carbon atoms represented by $R^2$ may be any of linear, branched or cyclic group, and includes the one having usually 1 to 6 and preferably 1 to 3 carbon atoms. Specifically, the group includes linear alkylene groups such as, for example, a methylene group, an ethylene group, a trimethylene group, a tetramethylene group, a pentamethylene group, a hexamethylene group; branched alkylene groups such as, for example, a propylene group, a methylmethylene group, a dimethylmethylene group, an ethylmethylene group, a methylethylene group, a methyltetramethylene group, an ethyltetramethylene group; cyclic alkylene groups such as, for example, a cyclopropylene group, a cyclobutylene group, a cyclopentylene group, a cyclohexylene group, and among them, the one having 1 to 3 carbon atoms such as, for example, a methylene group, an ethylene group, a trimethylene group, a propylene group, a dimethylmethylene group is preferable.

The epihalohydrin-modified polyamide exemplified as the (D-1) copper anticorrosive may be a commercially available product or may be synthesized as appropriate according to the common procedure, and the polyamide can be prepared, for example, by reacting epihalohydrin such as, for example, epichlorohydrin to a polymeric polyamide having a repeating unit which is obtained by reacting a corresponding dicarboxylic acid or a derivative thereof and diaminoalkylamine or a derivative thereof.

Commercially available product of relevant epihalohydlin-modified polyamide includes, for example, Euramine P-5500 [Trade Name, produced by Mitsui Chemicals Inc.] (an aqueous solution of epihalohydrin-modified polyamide having molecular weight of 4,000 to 5,000 in 12.5% by weight), Euramine P-5600 [Trade Name, produced by Mitsui Chemicals Inc.] (an aqueous solution of epihalohydrin-modified polyamide having molecular weight of 2,000 to 3,000 in 30.0% by weight), WS-4020 [Trade Name, produced by Seiko PMC Corp.] (an aqueous solution of epihalohydrin-modified polyamide having molecular weight of 400,000 to 600,000 in 25% by weight), and the like, all of which are aqueous solutions containing epihalohydrin-modified polyamide.

Molecular weight of the epihalohydrin-modified polyamide exemplified as the (D-1) copper anticorrosive is usually 2,000 to 1,000,000, preferably 2,000 to 800,000, and more preferably 3,000 to 600,000.

The benzotriazole compound exemplified as the (D-1) copper anticorrosive in the etching agent relevant to the present invention <1> includes benzotriazole and derivatives thereof. Benzotriazole derivatives include the compounds in which the benzotriazole ring has a substituent such as, for example, a carboxyl group; an alkyl group having 1 to 6 carbon atoms such as, for example, a methyl group, an ethyl group, a propyl group; a halogen atom such as, for example, a fluorine atom a chlorine atom, a bromine atom, an iodine atom; and the like. Specifically, for example, 4-carboxybenzotriazole, 5-carboxybenzotriazole, 5-methylbenzotriazole, 5-chlorobenzotriazole, and the like, are included.

The hydroxycarboxylic acid exemplified as the (D-1) copper anticorrosive in the etching agent relevant to the present invention <1> includes a hydroxytricarboxylic acid such as, for example, citric acid, isocitric acid; a hydroxycarboxylic acid such as, for example, glycolic acid, lactic acid, glyceric acid, tartronic acid, malic acid, tartaric acid, mevalonic acid and pantoic acid.

The nitrogen-containing cyclic compound exemplified as the (D-1) copper anticorrosive in the etching agent relevant to the present invention <1> includes, for example, a nucleic-acid base, and specifically includes purine derivatives such as, for example, adenine, guanine, 2-aminopurine, guanosine; pyrimidine derivatives such as, for example, cytosine, thymine, uracil, 6-methyluracil, 5-ethyluracil; hetero-ring-containing carboxylic acids such as, for example, quinaldic acid; amino acids such as, for example, cysteamine hydrochloride; bipyridyl; and the like. In this connection, these copper anticorrosives may be used in suitable mixing of two or more kinds.

Among these (D-1) copper anticorrosives, for example, epihalohydrin-modified polyamide, benzotriazole (BTA), citric acid, adenine, and the like are preferable.

In the etching agent relevant to the present invention <1>, use concentration of the (D-1) copper anticorrosive is not especially limited, so long as it is a concentration, which is usable as the copper anticorrosive, or more. Specifically, the concentration is usually 0.05 to 5% by weight, preferably 0.05 to 2% by weight, and more preferably 0.08 to 1.5% by weight as a concentration in said etching agent.

In the etching agent relevant to the present invention <2>, (D-2) 0.01 to 3% by weight of two or more kinds of anion species other than phosphonic acid chelating agents having a hydroxyl group, in which anion species have no oxidizing power, is used in the etching agent for a W-based metal film on a semiconductor substrate on which a metal bump or a metal wiring having lower ionization tendency than that of tungsten, among the etching agents of the present invention. Relevant anion species means an anion species derived from a compound which can be dissociated to cation and anion in an aqueous solution, and more specifically, the anion species means an anion which is generated when an inorganic acid or an organic acid is dissociated in an aqueous solution, that is, an anion species derived from an inorganic acid or an organic acid. In this connection, in the anion species in this context, hydroxide ion generated from the (C) at least one or more kinds of basic compound selected from the (c-1) inorganic alkalis and the (c-2) organic amines is not included.

Relevant anion species derived from an inorganic acid, specifically, includes, for example, a sulfate ion, a sulfite ion, a chloride ion, a phosphate ion, a phosphite ion, a hypophosphite ion, and the like. Among them, a sulfate ion, a chloride ion and a phosphate ion are preferable.

Relevant anion species derived from an organic acid, specifically, includes, for example, a carbonate ion; a monocarboxylate ion such as, for example, an acetate ion; a hydroxytricarboxylate ion such as, for example, a citrate ion, an isocitrate ion; a hydroxycarboxylate ion such as, for example, a glycolate ion, a lactate ion, a glycerate ion, a tartronate ion, a malate ion, a tartrate ion, a mevalonate ion, a pantoate ion; and the like. Among them, a carbonate ion, an acetate ion, a citrate ion and a malate ion are preferable, and among them, a citrate ion and a malate ion are more preferable.

Use concentration of the (D-2) two or more kinds of anion species other than phosphonic acid chelating agents having a hydroxyl group, in which anion species have no oxidizing power, is required to be 0.01 to 3% by weight as a concentration in the etching agent relevant to the present invention <2>. Among them, the concentration is preferably 0.02 to 1% by weight, more preferably 0.03 to 0.5% by weight, and particularly preferably 0.03 to 0.3% by weight. In particular, by controlling the use concentration of the anion species to 0.3% by weight or less, the effect for which the present invention desires can be surely obtained.

The (D-2) two or more kinds of anion species other than phosphonic acid chelating agents having a hydroxyl group, in which anion species have no oxidizing power, have the following two effects: an effect to maintain pH of a solution (an aqueous solution) in the etching agent relevant to the present invention <2> constant, that is, an effect as a buffering agent, and an effect to inhibit the Galvanic corrosion which is one of the effects of the present invention. In order to exhibit the effect as this buffering agent and the effect to inhibit the Galvanic corrosion, total percent by weight of the anion species in an aqueous solution of the etching agent relevant to the present invention <2> becomes an important role. In too low concentration, the function as a buffering agent cannot be exhibited, contrary too high concentration promotes the Galvanic corrosion. Consequently, the use concentration of relevant anion species is required to be at least 0.01 to 3% by weight as mentioned above briefly.

Among the (D-2) 0.01 to 3% by weight of two or more kinds of anion species other than phosphonic acid chelating agents having a hydroxyl group, in which anion species have no oxidizing power, a combination of 0.0001 to 0.5% by weight of at least one or more kinds of anion species derived from an inorganic acid selected from a sulfate ion, a sulfite ion, a chloride ion, a phosphate ion, a phosphite ion and a hypophosphite ion and 0.0099 to 2.5% by weight of at least one or more kinds of anion species derived from an organic acid selected from a citrate ion and a malate ion; a combination of 0.0001 to 0.5% by weight of any one anion species derived from an organic acid selected from a carbonate ion, an acetate ion, a citrate ion and a malate ion and 0.0099 to 2.5% by weight of anion species derived from an organic acid selected from a citrate ion and a malate ion which is other than the above selected anion species derived from an organic acid; and a combination of 0.0001 to 0.5% by weight of at least one or more kinds of anion species derived from an inorganic acid selected from a sulfate ion and a chloride ion and 0.0099 to 2.5% by weight of at least one or more kinds of anion species derived from an inorganic acid selected from a phosphate ion, a phosphite ion and a hypophosphite ion; and the like are suitably used.

In the etching agent relevant to the present invention <2>, by using different two or more kinds of anion species in combination of at least one anion species acting as an effect to inhibit bimetallic corrosion (Galvanic corrosion) and further at least one anion species acting as a buffering agent, the bimetallic corrosion (Galvanic corrosion), which is one of the effects intended by the present invention, can be surely inhibited. In this connection, the anion species acting as an effect to inhibit the bimetallic corrosion (Galvanic corrosion) includes at least one or more kinds of anion species derived from an inorganic acid selected from a sulfate ion, a sulfite ion, a chloride ion, a phosphate ion, a phosphite ion and a hypophosphite ion, and at least one or more kinds of anion species derived from an organic acid selected from a carbonate ion, an acetate ion, a citrate ion and a malate ion as a preferable one. The anion species acting as a buffering agent includes at least one or more kinds of anion species derived from an inorganic acid selected from a phosphate ion, a phosphite ion and a hypophosphite ion, and at least one or more kinds of anion species derived from an organic acid selected from a citrate ion and a malate ion as a preferable one. In addition, an anion, which can be used for both purposes, includes a phosphate ion, a phosphite ion, a hypophosphite ion, a citrate ion and a malate ion, as a preferable one.

Relevant anion species acting to inhibit the bimetallic corrosion (Galvanic corrosion) is required to be used in a small amount, and specific use concentration is usually 0.0001 to 0.5% by weight, preferably 0.001 to 0.2% by weight, and more preferably 0.002 to 0.2% by weight as a concentration in the etching agent relevant to the present invention <2>. Use of an amount exceeding 0.5% by weight is not preferable, because concentration of electrolyte becomes too high in the etching agent, and handover of electron easily occurs in such environment, resulting in facilitating the bimetallic corrosion (Galvanic corrosion) contrary. These anion species maintain electric double layer formed on a W-based metal film by hydroxide ion, while exhibit an action capable of dispersing electric effect in a wide range.

On the other hand, specific use concentration of the anion species acting as a buffering agent is usually 0.0099 to 2.5% by weight, preferably 0.019 to 0.8% by weight, more preferably 0.028 to 0.3% by weight, and still more preferably 0.028 to 0.1% by weight as a concentration in the etching agent relevant to the present invention <2>. Total value of the anion species acting as the buffering agent and the anion species acting as an effect to inhibit the above-described bimetallic corrosion (Galvanic corrosion) becomes the use concentration of the above-described two or more kinds of anion species other than phosphonic acid chelating agents having a hydroxyl group, in which anion species have no oxidizing power. As mentioned above briefly, when the use concentration of the anion species acting as an effect to inhibit bimetallic corrosion (Galvanic corrosion) is 0.002 to 0.2% by weight, and the use concentration of the anion species acting as a buffering agent is decreased as less as possible, that is, in a range of 0.028 to 0.1% by weight, buffering action can be maintained while bimetallic corrosion (Galvanic corrosion) can be inhibited more surely.

Supply form of these two or more kinds of anion species other than phosphonic acid chelating agents having a hydroxyl group, in which anion species have no oxidizing power, is not especially limited, so long as these anion species are dissociated in an aqueous solution to become relevant anion species. These anion species may be provided, for example, as an inorganic acid or an organic acid such as sulfuric acid, sulfurous acid, hydrochloric acid, phosphoric acid, carbonic acid, acetic acid, citric acid, malic acid, or in a form of a salt of an inorganic acid or an organic acid such as sodium sulfate, sodium sulfite, sodium chloride, sodium phosphate, sodium hydrogenphosphate, sodium carbonate, sodium hydrogencarbonate, sodium acetate, sodium citrate, sodium malate. However, in the etching agent relevant to the present invention <2>, since kind of cation species in the etching agent becomes occasionally important, these anion species are preferably provided in a form of sodium salt or quaternary ammonium salt thereof when provided in a form of salt.

Citric acid, malic acid, and the like which is "copper anticorrosive" to be added to the etching agent relevant to the present invention <1>, are included in the "two or more kinds of anion species other than phosphonic acid chelating agents having a hydroxyl group, in which anion species have no oxidizing power" in the etching agent relevant to the present invention <2>. These compounds are added in a concentration range in which they can act as a "copper anticorrosive" when they are used as a "copper anticorrosive", and also added in a concentration range in which they can act as "inhibiting action for bimetallic corrosion (Galvanic corrosion)" and "buffering agent" when they are used as "two or more kinds of anion species other than phosphonic acid chelating agents having a hydroxyl group, in which anion species have no oxidizing power". Therefore, in the etching agents relevant to the present inventions <1> and <2>, citric acid, malic acid, and the like may occasionally exhibit an effect of "copper anticorrosive" and "two or more kinds of anion species other than phosphonic acid chelating agents having a hydroxyl group, in which anion species have no oxidizing power" depending on the amount thereof to be added. Thus, addition of citric acid, malic acid, and the like for both purposes is not excluded. That is, in the etching agent relevant to the present invention <1>, in addition to "copper anticorrosive", hydroxytricarboxylic acid such as citric acid and hydroxycarboxylic acid such as malic acid among the "two or more kinds of anion species other than phosphonic acid chelating agents having a hydroxyl group, in which anion species have no oxidizing power" may be used in combination, but it is desirable that total use concentration of "copper anticorrosive" and relevant hydroxytricarboxylic acid or hydroxycarboxylic acid is set in the concentration range of "copper anticorrosive" as described above. On the other hand, in the etching agent relevant to the present invention <2>, in addition to "two or more kinds of anion species other than phosphonic acid chelating agents having a hydroxyl group, in which anion species have no oxidizing power", "copper anticorrosive" may be used in combination, but as described later, it is desirable that a "compound which dissociates in an aqueous solution to generate relevant anion species" as a copper anticorrosive is not used, and even when used, a total percent by weight of the anion species should be set at a concentration within the above-described range.

As described heretofore, the etching agent relevant to the present invention <1> is an etching agent for a semiconductor substrate composed of a solution including at least (A) hydrogen peroxide, (B) a phosphonic acid chelating agent having a hydroxyl group, (c-1) an inorganic alkali, and (D-1) a copper anticorrosive. On the other hand, the etching agent relevant to the present invention <2> is an etching agent for a semiconductor substrate composed of a solution including (A) hydrogen peroxide, (B) a phosphonic acid chelating agent having a hydroxyl group, (C) at least one or more kinds of basic compound selected form (c-1) inorganic alkalis and (c-2) organic amines, and (D) 0.01 to 3% by weight of two or more kinds of anion species other than phosphonic acid chelating agents having a hydroxyl group, in which anion species have no oxidizing power.

The etching agent relevant to the present invention <1> is the one including at least (A) hydrogen peroxide, (B) a phosphonic acid chelating agent having a hydroxyl group, (c-1) an inorganic alkali, and (D-1) a copper anticorrosive, and pH of relevant solution is adjusted and maintained in a range of usually 7 to 10, preferably 8 to 9.5, and more preferably 8.5 to 9.2.

Too high pH of relevant solution causes problems such as, for example, lowering in stability of hydrogen peroxide, increase of corrosion in neighboring metals (Al, and the like) and semiconductor substrates (Si, and the like), and contrary, too low pH causes problems such as, for example, decrease in etching rate for Ti, decrease in complex-forming ability of chelating agent, unbalanced etching rate for Ti and W in TiW alloy, generation of etching residue, increase of side-etching. Therefore, pH is preferably adjusted and maintained in the range as described above.

For the purpose to maintain the solution relevant to the present invention in the above-described pH range, if necessary, a pH adjuster, which is usually used in this field, may be used. In addition to the above-described inorganic alkalis, the pH adjuster may be further used, if necessary, for the purpose to improve, for example, stability of the solution.

Relevant pH adjuster includes, for example, boric acid, nitric acid, hydrochloric acid, sulfuric acid, hydrofluoric acid, and the like. In this connection, as to these pH adjusters, two or more kinds of adjustors may be used in combination as appropriate. In addition, use concentration of relevant pH adjuster is usually 0.05 to 4% by weight, preferably 0.2 to 3% by weight, and more preferably 1 to 2% by weight.

The etching agent relevant to the present invention <2> is the one including at least (A) hydrogen peroxide, (B) a phosphonic acid chelating agent having a hydroxyl group, (C) at least one or more kinds of basic compound selected form (c-1) inorganic alkalis and (c-2) organic amines, and (D-2) 0.01 to 3% by weight of two or more kinds of anion species other than phosphonic acid chelating agents having a hydroxyl group, in which anion species have no oxidizing power, and pH of relevant solution is adjusted and maintained in a range of usually 6 to 10, preferably 6 to 9, and more preferably 7 to 8.5.

Too high pH of relevant solution causes problems such as, for example, lowering in stability of hydrogen peroxide, increase of corrosion in neighboring metals (Al, and the like) and semiconductor substrates (Si, and the like), and the like, and contrary, too low pH causes problems such as, for example, decrease in etching rate for W, decrease in complex-forming ability of phosphonic acid chelating agent having a hydroxyl group, unbalanced etching rate for Ti and W in TiW alloy, generation of etching residue, increase of side-etching. Therefore, pH is preferably adjusted and maintained in the range as described above.

In the etching agent relevant to the present invention <2>, since total percent by weight of the anion species in the solution becomes important, concentration range of the above-described (C) at least one or more kinds of basic compounds selected from (c-1) inorganic alkalis and (c-2) organic amines and (D-2) two or more kinds of anion species other than phosphonic acid chelating agents having a hydroxyl group, in which anion species have no oxidizing power, is preferably adjusted in a range of 0.01 to 3% by weight, and also pH of the solution is preferably adjusted and maintained in the range as described above. That is, in the etching agent relevant to the present invention <2>, since concentration range of the anion species becomes important, it is desirable that a compound, which dissociates in an aqueous solution to generate relevant anion species, other than (D-2) two or more kinds of anion species other than phosphonic acid chelating agents having a hydroxyl group, in which anion species have no oxidizing power, and the like are not used.

The etching agent relevant to the present invention can be prepared by mixing and dissolving (A) hydrogen peroxide, (B) a phosphonic acid chelating agent having a hydroxyl group, (C) a basic compound and (D-1) a copper anticorrosive and/or (D-2) 0.01 to 3% by weight of two or more kinds of anion species other than phosphonic acid chelating agents having a hydroxyl group, in which anion species have no oxidizing power, in water, so as to obtain the concentrations as described above. In this connection, each component may be added in water and mixed sequentially in an appropriate order, or all of the components may be added and then dissolved in water. The thus prepared etching agent of the present invention is preferably subjected to filtration treatment, and the like before use. In addition, water to be used here may be distilled water, purified water, ion-exchanged water, ultrapure water, or the like which has been purified by distillation, ion-exchange treatment, and the like.

In the etching agent relevant to the present invention <1>, in addition to use (A) hydrogen peroxide, (B) a phosphonic acid chelating agent having a hydroxyl group, (c-1) an inorganic alkali, and (D-1) a copper anticorrosive, reagents which are usually used in the etching method well known per se can be used.

Such reagents include, for example, surfactants such as a nonionic surfactant, an anionic surfactant, a cationic surfactant and an amphoteric surfactant, which is used for the purpose to improve wettability to semiconductor surface by reducing surface tension of the solution, and the like. Among them, a nonionic surfactant such as NCW 1002 (polyoxyethylene-polyoxypropylene alkyl ether, produced by Wako Pure Chemical Industries Ltd.), and the like is particularly preferable. These surfactants may be used in a concentration range usually used in this field, and the concentration is usually 0.001 to 1% by weight, and preferably 0.01 to 0.5% by weight, as a concentration of the etching agent relevant to the present invention <1>.

On the other hand, in the etching agent relevant to the present invention <2>, in addition to use (A) hydrogen peroxide, (B) a phosphonic acid chelating agent having a hydroxyl group, (C) at least one or more kinds of basic compounds selected from (c-1) inorganic alkalis and (c-2) organic amines, and (D-2) 0.01 to 3% by weight of two or more kinds of anion species other than phosphonic acid chelating agents having a hydroxyl group, in which anion species have no oxidizing power, surfactant, and the like can be used. However, since total percent by weight of the anion species in the solution becomes important in relevant etching agent, as described above briefly, it is desirable that other component which influences on this percent by weight should not be contained.

The surfactant to be used, if necessary, in the etching agent relevant to the present invention <2> includes, for example, surfactants such as a nonionic surfactant, an anionic surfactant, a cationic surfactant and an amphoteric surfactant, which is used for the purpose to improve wettability to semiconductor surface by reducing surface tension of the solution, and the like. Among these surfactants, it is obvious that a compound which does not dissociate in an aqueous solution to generate no anion species is preferable. In addition, amount to be used of these surfactants is usually 0.001 to 1% by weight, and preferably 0.01 to 0.5% by weight, as a concentration in the etching agent relevant to the present invention <2>.

The etching agent of the present invention is the one which is prepared by using, as main components, (A) hydrogen peroxide, (B) a phosphonic acid chelating agent having a hydroxyl group, (C) a basic compound and (D-1) a copper anticorrosive and/or (D-2) 0.01 to 3% by weight of two or more kinds of anion species other than phosphonic acid chelating agents having a hydroxyl group, in which anion species have no oxidizing power, as described above, and provided in a various forms, for example, in one-liquid system or multi-liquid system such as two-liquid system. In this connection, when relevant etching agent is used, in the case of one-liquid system, it may be used as it is, and in the case of multi-liquid system such as two-liquid system, a solution containing all components as described above may be prepared by mixing all solutions as appropriate before use, and may be used.

Among them, from the viewpoints of safety in during transportation and storage, or the like, or stability of the solution, and the like, multi-liquid system of two or more-liquid system is preferable, in particular, from the viewpoints of stability and convenience, two-liquid system is preferable. Specifically, for example, from the viewpoints of inhibiting performance deterioration of the etching agent caused by decomposition of hydrogen peroxide and avoiding instability of hydrogen peroxide due to coexistence of the basic compound (alkali compound), an etching agent of two-liquid system composed of (1) a solution including hydrogen peroxide and (2) a solution including a phosphonic acid chelating agent having a hydroxyl group, a basic compound, and a copper anticorrosive and/or two or more kinds of anion species other than phosphonic acid chelating agents having a hydroxyl group, in which anion species have no oxidizing power (hereinafter, optionally may be abbreviated as a liquid for preparing an etching agent relevant to the present invention) is preferable.

In the above-described multi-liquid system such as two-liquid system, use concentration of each component in each solution may be selected as appropriate so that a concentration in the solution in which all solutions are prepared by mixing as appropriate and all of relevant components are contained, that is, a final concentration falls in the concentration range as described above, and each component may be contained in the selected concentration in each solution. That is, for example, when the etching agent relevant to the present invention <1> is made to two-liquid system, two liquids may be prepared, respectively, in the following way: a solution (First Liquid) including 10 to 50% by weight, preferably 15 to 30% by weight, more preferably 15 to 26% by weight, and still more preferably 20 to 26% by weight of hydrogen peroxide and a liquid for preparing an etching solution (Second Liquid) composed of a solution including 0.1 to 3% by weight, preferably 0.2 to 2% by weight, more preferably 0.3 to 1% by weight, and still more preferably 0.4 to 0.8% by weight of phosphonic acid chelating agent having a hydroxyl group, 0.2 to 12% by weight, preferably 0.5 to 10% by weight, and more preferably 0.8 to 4% by weight of inorganic alkali, and 0.05 to 5% by weight, preferably 0.05 to 2% by weight, and more preferably 0.08 to 1.5% by weight of copper anticorrosive, are mixed as appropriate so that a mixing ratio (ratio by weight) [First Liquid:Second Liquid] becomes usually 1:9 to 98:2, preferably 4:6 to 9:1, and more preferably 6:4 to 8:2, and so that each concentration in a prepared solution, in which all of relevant components are contained, that is, each final concentration becomes usually 10 to 35% by weight, preferably 15 to 30% by weight, more preferably 15 to 26% by weight, and still more preferably 20 to 26% by weight of hydrogen peroxide, usually 0.1 to 3% by weight, preferably 0.2 to 2% by weight, more preferably 0.3 to 1% by weight, and still more preferably 0.4 to 0.8% by weight of phosphonic acid chelating agent having a hydroxyl group, usually 0.2 to 12% by weight, preferably 0.5 to 10% by weight, and more preferably 0.8 to 4% by weight of inorganic alkali, and usually 0.05 to 5% by weight, preferably 0.05 to 2% by weight, and more preferably 0.08 to 1.5% by weight of copper anticorrosive.

In addition, when the etching agent relevant to the present invention <2> is made to two-liquid system, two liquids may be prepared, respectively, in the following way: a solution (First Liquid) including 10 to 35% by weight, preferably 20 to 35% by weight, more preferably 24 to 35% by weight, and still more preferably 30 to 35% by weight of hydrogen peroxide and a liquid for preparing an etching solution (Second Liquid) composed of a solution including 0.1 to 30% by weight, preferably 0.1 to 20% by weight, more preferably 0.15 to 10% by weight, and still more preferably 0.2 to 6% by weight of phosphonic acid chelating agent having a hydroxyl group, 0.1 to 48% by weight, preferably 0.1 to 30% by weight, and more preferably 0.1 to 20% by weight of at least one or more kinds of basic compounds selected from inorganic alkalis and organic amines, as well as 0.01 to 6% by weight, preferably 0.02 to 2% by weight, more preferably 0.03 to 1% by weight, and still more preferably 0.03 to 0.6% by weight of two or more kinds of anion species other than phosphonic acid chelating agents having a hydroxyl group, in which anion species have no oxidizing power, are mixed as appropriate so that a mixing ratio (ratio by weight) [First Liquid:Second Liquid] becomes usually 30:70 to 99:1, preferably 60:40 to 95:5, and more preferably 80:20 to 95:5, and so that each concentration in a prepared solution in which all of relevant components are contained, that is, each final concentration becomes usually 10 to 35% by weight, preferably 15 to 35% by weight, more preferably 20 to 35% by weight, and still more preferably 24 to 32% by weight of hydrogen peroxide, usually 0.1 to 3% by weight, preferably 0.1 to 2% by weight, more preferably 0.15 to 1% by weight, and still more preferably 0.2 to 0.6% by weight of phosphonic acid chelating agent having a hydroxyl group, usually 0.1 to 5% by weight, preferably 0.2 to 4% by weight, and more preferably 0.2 to 2% by weight of at least one or more kinds of basic compounds selected from inorganic alkalis and organic amines, and usually 0.01 to 3% by weight, preferably 0.02 to 1% by weight, and more preferably 0.03 to 0.5%, and still more preferably 0.03 to 0.3% by weight of two or more kinds of anion species other than phosphonic acid chelating agents having a hydroxyl group, in which anion species have no oxidizing power.

In addition, in the two-liquid system as described above, pH of each solution is also not especially limited, and may be adjusted so that pH of a solution in which all solutions are prepared by mixing as appropriate and all of components as described above are contained, that is, final pH falls in the pH range as described above. In another words, for example, in the case of two-liquid system as described above, pH of each solution may be adjusted so that final pH after mixing the two liquids becomes usually pH 7 to 10, preferably pH 8 to 9.5, and more preferably pH 8.5 to 9.2 in the etching agent relevant to the present invention <1>, and usually pH 6 to 10, preferably pH 6 to 9, and more preferably pH 7 to 8.5 in the etching agent relevant to the present invention <2>.

Etching method in the etching agent relevant to the present invention <1> may be carried out by processing the following substrate with the etching agent of the present invention, for example, by contacting an etching agent composed of a solution comprising at least (A) hydrogen peroxide, (B) a phosphonic acid chelating agent having a hydroxyl group, (c-1) an inorganic alkali, and (D-1) a copper anticorrosive and a Ti-based metal film on a semiconductor substrate.

Etching method in the etching agent relevant to the present invention <2> may be carried out by processing the following substrate with the etching agent of the present invention, for example, by contacting an etching agent composed of a solution comprising at least (A) hydrogen peroxide, (B) a phosphonic acid chelating agent having a hydroxyl group, (C) at least one or more kinds of basic compounds selected from (c-1) inorganic alkalis and (c-2) organic amines, and (D-2) 0.01 to 3% by weight of two or more kinds of anion species other than phosphonic acid chelating agents having a hydroxyl group, in which anion species have no oxidizing power, and a W-based metal film on a semiconductor substrate.

That is, the etching method of the present invention may be carried out according to the etching method well known per se such as dipping method, spray etching method, except that a substrate is etched using the etching agent relevant to the present invention as described above.

In addition, in the etching method of the present invention, the liquid for preparing an etching agent of the present invention (that is, the liquid for preparing an etching agent composed of a solution including a phosphonic acid chelating agent having a hydroxyl group, and a copper anticorrosive and/or two or more kinds of anion species other than phosphonic acid chelating agents having a hydroxyl group, in which anion species have no oxidizing power) may be mixed as appropriate with a solution including hydrogen peroxide at the point of use, to prepare a solution which contains all of the above-described components (etching agent) and it may be used.

Specific example of the etching method well known per se includes, for example, (1) a method in which a semiconductor substrate on which a Ti-based metal film or a W-based metal film has been formed is dipped in an etching agent; (2) a method in which a semiconductor substrate on which a Ti-based metal film or a W-based metal film has been formed is dipped into an etching agent, and the solution is stirred in such a dipping state by mechanical means; (3) a method in which a semiconductor substrate on which a Ti-based metal film or a W-based metal film has been formed is dipped into an etching agent, and the solution is vibrated and stirred in such a dipping state by means of ultrasonic wave, or the like; (4) a method in which an etching agent is sprayed on a semiconductor substrate on which a Ti-based metal film or a W-based metal film has been formed; and the like.

In this connection, in the method of the present invention, when the etching as described above is carried out, the semiconductor substrate on which a Ti-based metal film or a W-based metal film has been formed may be vibrated, if necessary.

In addition, in the method of the present invention, etching system is not especially limited, and, for example, batch type, sheet-fed type, and the like can be used.

The semiconductor substrate on which a Ti-based metal film has been formed to which the etching agent and the etching method relevant to the present invention <1> are applied includes, for example, a substrate provided with Cu wiring on relevant semiconductor substrate on which a Ti-based metal film has been formed, and the like.

Metal constituting Pb-free solder relevant to the step, in which the etching agent relevant to the present invention <1> is used, is Sn alloys which contain tin (Sn) as a main component, for example, includes alloys which are composed of one or more kinds of metals selected from silver (Ag), bismuth (Bi), indium (In), copper (Cu), nickel (Ni), zinc (Zn), aluminum (Al), antimony (Sb), gold (Au), and the like and Sn. Specific example of the Pb-free solder includes, for example, Sn—Ag system, Sn—Ag—Bi—In system, Sn—Ag—Bi system, Sn—Cu system, Sn—Cu—Ag system, Sn—Ag—Bi—Cu system, Sn—Cu—Ni system, Sn—Zn system, Sn—Zn—Bi system, Sn—Zn—Al system, Sn—Zn—In system, Sn—Bi system, Sn—Bi—In system, Sn—Sb system, Sn—In system, Sn—Au system, and the like. Among them, Sn—Cu system, Sn—Ag system, Sn—Cu—Ag system, and the like are preferable, and Sn—Cu system is more preferable.

The etching agent and the etching method relevant to the present invention <1> is suitably used in a substrate step in which the Pb-free solder bump is produced on the semiconductor substrate relevant to the present invention, that is, the semiconductor substrate on which a Ti-based metal film has been formed, in particular, the semiconductor substrate provided with Cu wiring on relevant Ti-based metal film.

A method for forming the Pb-free solder bump may be carried out according to the method usually used in this field. The Pb-free solder bump may be formed, for example, by forming a pattern, on the semiconductor substrate relevant to the present invention, that is, on a semiconductor substrate on which Ti-based metal film has been formed, by application of a resist if necessary, then laminating thereon one or more kinds of metal films selected from the metals constituting the Pb-free solder, after that, subjecting the metals constituting the Pb-free solder to plate processing, and further processing according to the common method in this field such as heating, or the like.

In addition, when a substrate further provided with Cu wiring on relevant Ti-based metal film is used, in order to enhance adhesion of the Cu wiring and a Sn alloy constituting the Pb-free solder bump, for example, a Ni film, a Cr film, or the like may be formed on the Cu wiring.

On the other hand, the semiconductor substrate, on which a W-based metal film has been formed, to which the etching agent and the etching method relevant to the present invention <2> are applied includes, for example, a substrate provided with a metal bump or a metal wiring having lower ionization tendency than that of tungsten on the upper part of relevant semiconductor substrate on which relevant W-based metal film has been formed, and the like.

The metal constituting a metal bump or a metal wiring having lower ionization tendency than that of tungsten relevant to the step in which the etching agent relevant to the present invention <2> is used includes gold (Au), silver (Ag), palladium (Pd), tin (Sn) or alloys of these metals, or alloys containing these metals as a main component. These metals are those which constitute a metal bump or a metal wiring causing bimetallic corrosion (Galvanic corrosion) due to lower ionization tendency than that of tungsten. In addition, among these metal bumps or metal wirings, gold (Au) bump or gold (Au) wiring is preferable.

A method for forming relevant metal bump or metal wiring may be carried out according to the method to be usually used in this field. Specifically, relevant metal bump or metal wiring may be formed, for example, by forming a circuit with using a resist, and the like on a semiconductor substrate to be used in the present invention, that is, on a semiconductor substrate on which a W-based metal film has been formed, then further processing by plating, chemical vapor deposition, and the like.

In this connection, when a substrate on which, for example, gold bump has been formed on relevant W-based metal film is used, in order to improve adhesion between the W-based metal film and relevant bump, a conductor adhesion site of nickel (Ni) film, palladium (Pd) film, copper (Cu) film, and the like may exist between them.

The semiconductor substrate to be used in the present invention includes the one consisting of a silicon material such as silicon, amorphous silicon, polysilicon, silicon oxide film, silicon nitride film; and a compound semiconductor such as gallium-arsenic, gallium-phosphorus, indium-phosphorus. Among them, the etching agent and the etching method of the present invention is suitably used for a semiconductor substrate consisting of the silicon series materials.

The etching using the etching agent for Ti-based metal film on a semiconductor substrate on which a copper wiring has been formed, that is, the etching agent relevant to the present invention <1> is completed in a shorter time under a heated condition as compared with a time at room temperature, but at a high processing temperature, decomposition of hydrogen peroxide occurs vigorously, and lifetime of the etching liquid becomes shorter. As to the temperature in etching, the lower limit is usually room temperature or higher, preferably 20° C. or higher, and more preferably 25° C. or higher, and the upper limit is usually 60° C. or lower, preferably 50° C. or lower, and more preferably 40° C. or lower. That is, the temperature of the etching liquid of the present invention may be set at a temperature in the above-described range, and this etching liquid may be contacted with a substrate.

The etching using the etching agent for W-based metal film on a semiconductor substrate on which a metal bump or a metal wiring having lower ionization tendency than that of tungsten has been formed, that is, the etching agent relevant to the present invention <2> is not only completed in a shorter time under a heated condition as compared with a time at room temperature, but since difference of an etching rate between in the place where etching by said etching agent occurs and in the place where etching by bimetallic corrosion (Galvanic corrosion) occurs in parallel becomes relatively smaller, hence processing time when the etching agent and the metal contact each other becomes shorter, and therefore side-etching is more inhibited, the processing temperature is preferably set at a higher temperature than room temperature. Specifically, the etching agent may be set at a temperature in a range of, for example, 10 to 70° C., preferably 20 to 60° C., and more preferably 30 to 60° C., and this etching agent may be contacted with a substrate.

The etching processing time cannot be limited because surface condition and shape of the substrate to be processed is not fixed, but practically the processing time is usually 1 minute to 1 hour, preferably 1 to 30 minutes, and more preferably 1 to 15 minutes.

By carrying out the etching processing of a semiconductor substrate, on which a Ti-based metal film has been formed, using the etching agent for a Ti-based metal film on a semiconductor substrate, on which a copper wiring has been formed, relevant to the present invention, that is, the etching agent relevant to the present invention <1>, the Ti-based film can be selectively etched. In particular, when relevant etching agent is used for relevant substrate provided with Cu wiring on relevant Ti-based film, etching selection ratio of Ti to Cu can be improved. In addition, excess side-etching does not occur due to reduced amount of dissolved Cu, and further, since decomposition of hydrogen peroxide caused by Cu can be inhibited, lifetime of the etching agent is improved and process margin can be expanded.

In addition, the etching agent for a Ti-based metal film on a semiconductor substrate, on which a copper wiring has been formed, relevant to the present invention, that is, the etching agent relevant to the present invention <1> can be suitably used in a step in which Pb-free solder bump is formed.

By carrying out the etching processing of a semiconductor substrate, on which a W-based metal film has been formed, using the etching agent for a W-based metal film on a semiconductor substrate, on which a metal bump or a metal wiring having lower ionization tendency than that of tungsten has been formed, relevant to the present invention, that is, the etching agent relevant to the present invention <2>, not only W-based metal film can be rapidly etched, but also etching of a W-based metal film directly beneath relevant metal bump or metal wiring, so-called side-etching caused by bimetallic corrosion (Galvanic corrosion) by a metal bump or a metal wiring having lower ionization tendency than that of tungsten and tungsten can be inhibited.

In the etching agent for a W-based metal film on a semiconductor substrate, on which a metal bump or a metal wiring having lower ionization tendency than that of tungsten has been formed, relevant to the present invention, that is, the etching agent relevant to the present invention <2>, in particular, by using sodium hydroxide or tetramethylammonium hydroxide as (C) at least one or more kinds of basic compound selected from (c-1) inorganic alkalis and (c-2) organic amines, such advantages that bimetallic corrosion (Galvanic corrosion) can be inhibited, and the like, can be obtained, because electron transfer, in which the cation species such as sodium ion, quaternary ammonium ion generated from these basic compounds is one cause of the bimetallic corrosion (Galvanic corrosion), is inhibited, and electric influence can be dispersed in a wide range while electric double layer can be maintained due to existence of a small amount of a specific anion species such as a sulfate ion, a citrate ion, and the like.

Further, by using the liquid for preparing an etching agent of the present invention, since an etching agent can be used by mixing this liquid and a solution including hydrogen peroxide as appropriate at the point of use, the following advantages can be obtained: for example, performance deterioration of the etching agent caused by decomposition of hydrogen peroxide can be inhibited; instability of hydrogen peroxide can be avoided by coexistence with a basic compound (an alkali compound); and etching rate, for example, for a Ti-based metal film or a W-based metal film can be properly adjusted because hydrogen peroxide and relevant liquid for preparing etching agent can be mixed in an optional ratio; and the like.

By using alkali hydroxide and ammonia, in particular, alkali hydroxide as a pH adjuster of the liquid for preparing an etching agent in the etching agent relevant to the present invention <1>, when etching of a Ti-based metal film is carried out using the etching agent obtained by mixing this liquid and a solution including hydrogen peroxide, the following effects can be obtained: for example, etching selection ratio of Ti/Cu is improved; higher throughput can be expected due to higher dissolving rate of Ti, and the like, as compared with the case when pH is adjusted using an organic alkali such as, for example, tetramethylammonium hydroxide.

Hereinafter, the present invention will be specifically explained referring to Examples, Comparative Examples, and the like, but the present invention is not limited thereto by any means.

EXAMPLES

Example 1

(1) Preparation of an Etching Agent Relevant to the Present Invention <1>

An etching agent composed of the following composition was prepared.

| | |
|---|---|
| Hydrogen peroxide | 24.5% by weight |
| Phosphonic acid chelating agent (HEDPO) | 0.5% by weight |
| Copper anticorrosive (benzotriazole) | 0.1% by weight |
| Inorganic alkali (potassium hydroxide) | 2.0% by weight |
| Water | 72.9% by weight |
| pH | 9.0 |

* HEDPO = 1-hydroxyethylidene-1,1'-diphosphonic acid (2) Etching

Etching processing was carried out by dipping a Ti plate and a Cu plate of which surface areas and weights had been measured in advance in the etching agent of above-described (1) at room temperature for 10 minutes.

(3) Results

An appropriate amount of the etching agent after etching obtained in the above-described (2) was taken, and diluted with 0.1 mol/L nitric acid solution. After that, amounts of dissolved Ti and Cu were measured using an inductively-coupled plasma emission spectrophotometer (Trade Name: "SPS 3000 ICP emission spectrophotometer", produced by SII Nano Technology Inc.). From the obtained metal amounts, dissolution amounts per unit area were roughly estimated to calculate dissolution rates (nm/min). Results and ratios of dissolution rate for Ti/Cu are shown together in Table 1.

Examples 2 to 5

(1) Preparation of Etching Agents Relevant to the Present Invention <1>

Etching agents were prepared in the same way as in Example 1, except that each component in the etching agents was used in a specified amount as shown in Table 1 below.

(2) Etching

Etching was carried out in the same way as in Example 1.

(3) Results

Metal amounts on the surfaces of the etched Cu plate and Ti plate were measured in the same way as in Example 1. Results are shown together in Table 1. In this connection, in Table 1, content of water in each etching liquid was omitted.

TABLE 1

|  | Example 1 | Example 2 | Example 3 | Example 4 | Example 5 |
|---|---|---|---|---|---|
| $H_2O_2$ | 24.5% | 25% | 24.5% | 24.5% | 25% |
| Phosphonic Acid (HEDPO) | 0.5% | 0.5% | 0.5% | 0.5% | 0.5% |
| Inorganic Alkali | KOH 2% | KOH 3.8% | KOH 2.1% | KOH 2.2% | $NH_3$ 1.5% |
| Copper Anticorrosive | BTA 0.1% | EPA 1% | Adenine 0.1% | Citric Acid 0.1% | EPA 1% |
| pH | 9 | 9 | 9 | 9 | 9 |
| Ti Dissolution Rate (nm/min) | 48 | 35 | 45 | 48 | 103 |
| Cu Dissolution Rate (nm/min) | 0.05 | 0.05 | 0.22 | 0.34 | 2 |
| Ratio of Dissolution Rate for Ti/Cu | 960 | 694 | 205 | 141 | 51 |

* BTA = benzotriazole, EPA = epichlorohydrin-modified polyamide resin.

Comparative Examples 1 to 4

(1) Preparation of Etching Agents

Etching agents were prepared in the same way as in Example 1, except that each component in the etching agents was used in a specified amount as shown in Table 2 below.

(2) Etching

Etching was carried out in the same way as in Example 1.

(3) Results

Metal amounts on the surfaces of the etched Cu plate and Ti plate were measured in the same way as in Example 1. Results are shown together in Table 2.

TABLE 2

|  | Comparative Example 1 | Comparative Example 2 | Comparative Example 3 | Comparative Example 4 |
|---|---|---|---|---|
| $H_2O_2$ | 17.5% | 16.9% | 17.5% | 24.5% |
| Chelating Agent | EDTA 1% | HEDPO 0.5% | DEPPO 0.5% | HEDPO 0.5% |
| Alkali | $NH_3$ 1.9% | $NH_3$ 1.3% | KOH 1.5% | TMAH 2.5% |
| Copper Anticorrosive | — | — | — | BTA 0.1% |
| pH | 9.1 | 9.3 | 9 | 9 |
| Ti Dissolution Rate (nm/min) | 59 | 16 | 10 | 2.0 |
| Cu Dissolution Rate (nm/min) | 5.2 | 0.9 | 0.7 | 0 |
| Ratio of Dissolution Rate for Ti/Cu | 11 | 18 | 14 | — |

* EDTA = ethylenediamine tetraacetate, DEPPO = diethylenetriamine pentamethylene-phosphonic acid, TMAH = tetramethylammonium hydroxide.

As obvious from the results of Examples 1 to 5, by using the etching agent relevant to the present invention <1>, Ti could be efficiently etched while Cu was hardly etched.

On the other hand, as obvious from the results of Comparative Examples 1 to 3, when the etching agent not containing a copper anticorrosive was used, Cu tended to be easily etched, and hence Ti could not be etched efficiently.

In addition, as obvious from the results of Example 1 and Comparative Example 4, when an organic amine (TMAH) was used as an alkali, Cu was not etched at all and further Ti was also not etched almost. However, when an inorganic alkali (KOH) in the etching agent relevant to the present invention <1> was used as an alkali, it was found that Ti could be selectively etched, that is, Ti could be efficiently etched while Cu was hardly etched.

Further, as obvious from the results of Examples 2 and 5, it was found that when potassium hydroxide was used as an alkali, ratio of dissolution rate for Ti/Cu could be improved, that is, Ti could be selectively etched as compared with the case when ammonia was used.

Example 6

(1) Preparation of an Etching Agent Relevant to the Present Invention <1>

An etching agent composed of the following composition was prepared.

| | |
|---|---|
| Hydrogen peroxide | 24.5% by weight |
| Phosphonic acid chelating agent (60% HEDPO solution) | 0.8% by weight |
| [HEDPO content: about 0.5% by weight] | |
| Copper anticorrosive (benzotriazole) | 0.1% by weight |
| Inorganic alkali (potassium hydroxide) | 2.0% by weight |
| Water | 72.6% by weight |
| pH | 9.0 |

* HEDPO = Trade Name: "DEQEST 2010", produced by Solutia Japan Ltd. was used.

(2) Etching

Etching was carried out by dipping a Ti plate and a Cu plate in the etching agent of the above-described (1) at room temperature for 30, 60 and 90 minutes, respectively.

(3) Results

Concentrations of hydrogen peroxide in the etching agents before and after the etching were measured by oxidation-reduction titration, and decomposition rates of hydrogen peroxide before and after the etching were roughly estimated according to the following formula. Results are shown in Table 3.

Hydrogen peroxide decomposition rate=(Concentration of hydrogen peroxide before etching−Concentration of hydrogen peroxide after etching)×100/(Concentration of Hydrogen Peroxide Before Etching)

Comparative Example 5

(1) Preparation of an Etching Agent

An etching agent having the following composition was prepared.

| | |
|---|---|
| Hydrogen peroxide | 24.5% by weight |
| Nitrogen (N)-containing phosphonic acid chelating agent (25% DEPPO heptasodium salt aqueous solution) [DEPPO content: 0.5% by weight] | 2.0% by weight |
| Copper anticorrosive (benzotriazole) | 0.1% by weight |
| Inorganic alkali (potassium hydroxide) | 1.7% by weight |
| Water | 71.7% by weight |
| pH | 9.0 |

* DEPPO = Trade Name "DEQEST 2066", produced by Solutia Japan Ltd. was used.

(2) Etching

Etching was carried out in the same way as in Example 6.

(3) Results

Concentration of hydrogen peroxide was measured in the same way as in Example 6. Results are shown together in Table 3.

TABLE 3

| | Hydrogen Peroxide Decomposition Rate | | |
|---|---|---|---|
| | Dipping 30 min. | Dipping 60 min. | Dipping 90 min. |
| Example 6 | 2% | 4% | 6% |
| Comparative Example 5 | 4% | 8% | 13% |

As obvious from the results of Table 3, it was found that when nitrogen (N)-containing phosphonic acid chelating agent was used, lifetime of the etching agent became shorter due to high hydrogen peroxide decomposition rate, whereas when the phosphonic acid chelating agent relevant to the present invention (HEDPO) was used, lifetime of the etching agent became longer due to low hydrogen peroxide decomposition rate.

Example 7

(1) Preparation of an Etching Agent Relevant to the Present Invention <1>

An etching agent having the same composition as in Example 2 described in Table 1 was prepared.

(2) Etching

Etching was carried out by dipping a Ti plate and a Cu plate in the etching agent of the above-described (1) at 40° C. for 10, 20 and 30 minutes, respectively.

(3) Results

Concentrations of hydrogen peroxide in the etching agents before and after the etching were measured by oxidation-reduction titration, and decomposition rates of hydrogen peroxide before and after the etching were roughly estimated according to the following formula. Results are shown in Table 4.

Hydrogen peroxide decomposition rate=(Concentration of hydrogen peroxide before etching−Concentration of hydrogen peroxide after etching)×100/(Concentration of Hydrogen Peroxide Before Etching)

Example 8

(1) Preparation of an Etching Agent Relevant to the Present Invention <1>

An etching agent having the following composition was prepared.

| | |
|---|---|
| Hydrogen peroxide | 25.0% by weight |
| Phosphonic acid chelating agent (HEDPO) | 0.5% by weight |
| Copper anticorrosive (EPA) | 1.0% by weight |
| Inorganic alkali (ammonia) | 0.9% by weight |
| Water | 72.6% by weight |
| pH | 8.5 |

(2) Etching

Etching was carried out in the same way as in Example 7.

(3) Results

Concentration of hydrogen peroxide was measured in the same way as in Example 7. Results are shown together in Table 4.

TABLE 4

| | Hydrogen Peroxide Decomposition Rate | | |
|---|---|---|---|
| | Dipping 10 min. | Dipping 20 min. | Dipping 30 min. |
| Example 7 | 1% | 2% | 3% |
| Example 8 | 4% | 17% | 28% |

It has been known that stability of hydrogen peroxide is decreased under high pH condition. However, as obvious from the results of Table 4, it was found that when ammonia was used as an inorganic alkali (Example 8, pH: 8.5), hydrogen peroxide decomposition rate was higher and lifetime of the etching agent was shorter, even though pH was lower, as compared with the case when potassium hydroxide was used (Example 7, pH: 9.0). From the above description, it could be understood that, as an inorganic alkali to be used in the present invention, hydroxides of alkali metals such as potassium hydroxide, and the like are preferable.

Reference Example 1 and Examples 9 to Example 14

(1) Preparation of Etching Agents

An etching agent composed of the following composition was prepared. (The details of component are described in Table 5)

| | |
|---|---|
| Hydrogen peroxide | 28.0% by weight |
| Phosphonic acid chelating agent (HEDPO) | 0.34% by weight |
| Basic compound (sodium hydroxide) | 0.58% by weight |
| Citric acid (buffering agent) | 0.07% by weight |
| Sodium sulfate | 0.0 to 0.2% by weight |
| Water | Remainder |
| pH | 7.8 |

* HEDPO = 1-hydroxyethylidene-1,1'-diphosphonic acid

(2) Etching

A silicon wafer having gold (Au) bump on a titanium-tungsten (TiW) alloy film was dipped in each etching agent for each of Reference Example and Examples of the above-described (1), and etching was terminated when the TiW alloy film on the wafer surface disappeared. After the etching was terminated, the wafer was washed with pure water and dipped in a gold etching agent (Trade Name: "Au-Etchant", produced by Wako Pure Chemical Industries Ltd.) to dissolve the gold bump.

(3) Results

Regarding a TiW alloy film, which was masked with the gold bump and hence remained in a rectangular form, on the wafer obtained in the above-described (2), length of a side of the upper plane was observed and measured using a scanning electron microscope (Trade Name: "S-4800", produced by Hitachi High-Technologies Corp.). By assuming a side length of TiW alloy film in the case of the etching agent (Reference Example 1) not adding sodium sulfate as 100, and calculating relative length (%) of a side length of TiW alloy film remained after the etching in each Example, side-etching was compared. Results are shown in Table 5.

Comparative Example 6

(1) Preparation of an Etching Agent

An etching agent having the following composition was prepared.

| | |
|---|---|
| Hydrogen peroxide | 28.0% by weight |
| Phosphonic acid chelating agent (HEDPO) | 0.34% by weight |
| Inorganic alkali (sodium hydroxide) | 0.58% by weight |
| Citric acid (buffering agent) | 0.07% by weight |
| Sodium sfulfate | 1.0% by weight |
| Water | 70.0% by weight |
| pH | 7.8 |

(2) Etching

Etching was carried out in the same way as in Reference Example 1.

(3) Results

Measurements were carried out in the same way as in Reference Example 1. By assuming a side length of TiW alloy film in Reference Example 1 as 100, and calculating relative length (%) of a side length of TiW alloy film remained in a rectangular form, side-etching was compared. Results are shown in Table 6.

TABLE 6

| | Comparative Example 6 |
|---|---|
| $H_2O_2$ | 28.0% |
| Phosphonic Acid (HEDEPO) | 0.34% |
| Basic Compound | NaOH 0.58% |
| Citric Acid (Anion 1) | 0.07% |
| Sodium Sufate (Anion 2) | 1.0% |

TABLE 5

| | Reference Example 1 | Example 9 | Example 10 | Example 11 | Example 12 | Example 13 | Example 14 |
|---|---|---|---|---|---|---|---|
| $H_2O_2$ | 28.0% | 28.0% | 28.0% | 28.0% | 28.0% | 28.0% | 28.0% |
| Phosphonic Acid (HEDEPO) | 0.34% | 0.34% | 0.34% | 0.34% | 0.34% | 0.34% | 0.34% |
| Basic Compound | NaOH 0.58% | NaOH 0.58% | NaOH 0.58% | NaOH 0.58% | NaOH 0.58% | NaOH 0.58% | NaOH 0.58% |
| Citric Acid (Anion 1) | 0.07% | 0.07% | 0.07% | 0.07% | 0.07% | 0.07% | 0.07% |
| Sodium Sufate (Anion 2) | 0% | 0.001% | 0.005% | 0.01% | 0.02% | 0.1% | 0.2% |
| Relative Bump Side Length | 100 | 101 | 103 | 107 | 111 | 109 | 107 |
| pH | 7.8 | 7.8 | 7.8 | 7.8 | 7.8 | 7.8 | 7.8 |

TABLE 6-continued

|  | Comparative Example 6 |
|---|---|
| Relative Bump Side Length | 64.5 |
| pH | 7.8 |

As obvious from the results of Table 5 and Table 6, it was found that side-etching could be inhibited by adding an appropriate amount of sodium sulfate generating sulfate ion in an aqueous solution to an etching agent as compared with the etching agent not containing sodium sulfate (Reference Example 1). In addition, in contrast, since side-etching was promoted by using an excess amount of sodium sulfate generating sulfate ion in an aqueous solution, it was also found that percent by weight of an anion species in the solution was important in the etching agent relevant to the present invention <2>.

Examples 15 to 21

(1). Preparation of Etching Agents Relevant to the Present Invention <2>

Etching agents were prepared in the same way as in Example 9 except that a specified amount of sodium chloride or sodium hydrogenphosphate was used instead of sodium sulfate. Components of the anion 2 in relevant etching agents are shown in Table 7 and Table 8.

(2) Etching

Etching was carried out in the same way as in Reference Example 1.

(3) Results

Measurements were carried out in the same way as in Reference Example 1. By assuming a side length of TiW alloy film in Reference Example 1 as 100, and calculating relative length (%) of a side length of TiW alloy film remained in a rectangular form, side-etching was compared. Results are shown together with components of anion 2 in the etching agents, in Table 7 and Table 8.

TABLE 7

|  | Example 15 | Example 16 | Example 17 |
|---|---|---|---|
| Added Salt (Anion 2) | Sodium Chloride 0.004% | Sodium Chloride 0.016% | Sodium Chloride 0.08% |
| Relative Bump Side Length | 105 | 106 | 101 |
| pH | 7.8 | 7.8 | 7.8 |

TABLE 8

|  | Example 18 | Example 19 | Example 20 | Example 21 |
|---|---|---|---|---|
| Added Salt (Anion 2) | Sodium Hydrogen phosphate 0.005% | Sodium Hydrogen phosphate 0.02% | Sodium Hydrogen phosphate 0.1% | Sodium Hydrogen phosphate 0.2% |
| Relative Bump Side Length | 109 | 112 | 112 | 107 |
| pH | 7.8 | 7.8 | 7.8 | 7.8 |

As obvious from the results of Table 7 and Table 8, it was found that, similarly to sodium sulfate generating sulfate ion in an aqueous solution, even with sodium chloride generating chloride ion in an aqueous solution or sodium hydrogenphosphate generating phosphate ion in an aqueous solution, side-etching could be inhibited by adding it in an appropriate amount.

Examples 22 to 25 and Comparative Example 7

(1) Preparation of Etching Agents

Etching agents were prepared in the same way as in Example 9 except that specified amounts of salts generating specified anion species derived from inorganic acid or organic acid in an aqueous solution were used instead of sodium sulfate. Components of the anion 2 in relevant etching agents are shown in Table 9.

(2) Etching

Etching was carried out in the same way as in Reference Example 1.

(3) Results

Measurements were carried out in the same way as in Reference Example 1. By assuming a side length of TiW alloy film in Reference Example 1 as 100, and calculating relative length (%) of a side length of TiW alloy film remained in a rectangular, form, side-etching was compared. Results are shown together with components of anion 2 in the etching agents in Table 9.

TABLE 9

|  | Example 22 | Example 23 | Example 24 | Example 25 | Comparative Example 7 |
|---|---|---|---|---|---|
| Added Salt (Anion 2) | Sodium Sulfite 0.014% | Sodium Acetate 0.023% | Sodium Carbonate 0.012% | Sodium Malate 0.025% | Sodium Nitrate 0.016% |
| Relative Bump Side Length | 108 | 108 | 101 | 114 | 96 |
| pH | 7.8 | 7.8 | 7.8 | 7.8 | 7.8 |

As obvious from the results of Table 9, it was found that side-etching could be inhibited even with an anion species having reducing power such as sulfite ion in Example 22, acetate ion which was an anion species derived from organic acid, and further malate ion which was an anion species having chelating ability. On the other hand, it was also fount that side-etching could not be inhibited in the case of an anion species, such as sodium nitrate generating nitrate ion in an aqueous solution, having oxidizing power.

Examples 26 to 27 and Comparative Example 8

(1) Preparation of Etching Agents

Etching agents were prepared in the same way as in Example 9 except that a specified amount of malic acid instead of citric acid and further different percent by weight of sodium sulfate were used in Example 26 and that a specified amount of malic acid instead of citric acid and further a specified amount of a salt generating a specified anion species derived from organic acid in an aqueous solution, instead of sulfuric acid, were used in Example 27. In addition, in Comparative Example 8, an etching agent was prepared in the same way as in Example 9 except that a specified amount of sodium citrate instead of sodium sulfate was used. Each component of these etching agents is shown in Table 10.

(2) Etching

Etching was carried out in the same way as in Reference Example 1.

(3) Results

Measurements were carried out in the same way as in Reference Example 1. By assuming a side length of TiW alloy film in Reference Example 1 as 100, and calculating relative length (%) of a side length of TiW alloy film remained in a rectangular form, side-etching was compared. Results are shown together with each component in these etching agents in Table 10.

TABLE 10

|  | Example 26 | Example 27 | Comparative Example 8 |
|---|---|---|---|
| $H_2O_2$ | 28.0% | 28.0% | 28.0% |
| Phosphonic Acid (HEDEPO) | 0.34% | 0.34% | 0.34% |
| Basic Compound | NaOH 0.58% | NaOH 0.58% | NaOH 0.58% |
| Anion 1 | Malic Acid 0.05% | Malic Acid 0.05% | Citric Acid 0.07% |
| Anion 2 | Sodium Sulfate 0.02% | Disodium Citrate 0.033% | Disodium Citrate 0.033% |
| Relative Bump Side Length | 107 | 112 | 99 |
| pH | 7.9 | 7.9 | 7.8 |

As obvious from the results of Table 10, it was found that by adding specified amount of two or more kinds of different anion species in the etching agents, inhibition effect in side-etching could be obtained. In addition, it was also found that one of the anion species might be an anion species other than citric acid.

Reference Example 2 and Example 28

(1) Preparation of Etching Agents

In Reference Example 2, an etching agent was prepared in the same way as in Reference Example 1 except that, as a basic compound, a specified amount of tetramethylammonium hydroxide (TMAH) of an organic amine was used instead of NaOH of an inorganic alkali. And in Example 28, an etching agent was prepared in the same way as in Example 9 except that, as a basic compound, a specified amount of tetramethylammonium hydroxide (TMAH) of an organic amine was used instead of NaOH of an inorganic alkali in the same way as in Reference Example 2. Each component in these etching agents is shown in Table 11.

(2) Etching

Etching was carried out in the same way as in Reference Example 1.

(3) Results

Measurements were carried out in the same way as in Reference Example 1. By assuming a side length of TiW alloy film in Reference Example 2 as 100, and calculating relative length (%) of a side length of TiW alloy film remained in a rectangular form, side-etching was compared. Results are shown together with each component in these etching agents in Table 11.

TABLE 11

|  | Reference Example 2 | Example 28 |
|---|---|---|
| $H_2O_2$ | 28.0% | 28.0% |
| Phosphonic Acid (HEDPO) | 0.34% | 0.34% |
| Basic Compound | TMAH 1.3% | TMAH 1.3% |
| Anion 1 | Citric Acid 0.07% | Citric Acid 0.07% |
| Anion 2 | — | Sodium Sulfate 0.02% |
| Relative Bump Side Length | 100 | 104 |
| pH | 7.8 | 7.8 |

* TMAH = tetramethylammonium hydroxide

As obvious from the results of Table 11, it was found that even when basic compound was changed from NaOH of an inorganic alkali to TMAH of an organic amine, inhibition effect for side-etching could be obtained.

Reference Examples 3 to 5

(1) Preparation of Etching Agents

Etching agents composed of the compositions shown in Table 12 were prepared.

(2) Etching

Etching was carried out in the same way as in Reference Example 1.

(3) Results

Measurements were carried out in the same way as in Reference Example 1. By assuming a side length of TiW alloy film in Reference Example 1 as 100, and calculating relative length (%) of a side length of TiW alloy film remained in a rectangular form, side-etching was compared. Results are shown together with each component in these etching agents in Table 12.

TABLE 12

|  | Reference Example 3 | Reference Example 4 | Reference Example 5 |
|---|---|---|---|
| $H_2O_2$ | 24.5% | 24.5% | 24.5% |
| Phosphonic Acid (HEDPO) | 0.50% | 0.50% | 0.28% |
| Basic Compound | KOH 1.64% | KOH 3.00% | $NH_3$ 8.4% |
| Anion 1 | Citric Acid 1.04% | Citric Acid 0.05% | Boric Acid 0.7% |
| Relative Bump Side Length | 0 | 0 | 0 |
| pH | 7.7 | 8.9 | 10.7 |

As obvious from the results of Table 12, it was found that, when alkali concentration in the etching agent was high and two or more kinds of anion species was not used, side-etching could not be inhibited and all of the TiW alloy film masked with gold bump were scraped resulting in peeling off of the bump.

In the etching agent relevant to the present invention <2>, reduction of bimetallic corrosion is intended by containing specified amounts of anion species, which is not involved in dissolution, other than hydroxide ion to dissolve W-based metal film and phosphonic acid chelating agents having a hydroxyl group, in the etching agent, and dispersing electric double layer formed by hydroxide ion on the surface of W-based metal film due to bimetallic cell effect by a contact of tungsten and a metal (low ionization tendency metal) having lower ionization tendency than that of tungsten, not to localize in the vicinity of the interface where three of tungsten, the metal having lower ionization tendency than that of tungsten and an etching agent (electrolyte) are in contact each other. As obvious from the results of Examples 9 to 28, it was found that the anion species to be contained in the etching agent was desirably the one having no oxidizing power and capable of existing stably in an aqueous solution, and concentration of the anion species had to be adjusted in a range where transfer of electron was not too active by dispersing electric double layer from metal-contacting interface. On the other hand, it can be predicted that as transfer of electron by the cation species contained in the basic compound on the surface of relevant metal having lower ionization tendency than that of tungsten becomes more difficult, side-etching by bimetallic corrosion becomes less. In addition, as obvious from the results of Reference Examples 3 to 5, it became evident that as to the cation species contained in the basic compound, side-etching by bimetallic corrosion was more inhibited by sodium ion having lower molar electric conductivity than that of potassium ion and quaternary ammonium ion such as TMAH, which was an organic amine, as compared with potassium ion because transfer of electron hardly occurred. Further, it was indicated that concentration range thereof was also limited. From these results, by using the etching agent and the etching method relevant to the present invention <2>, it becomes possible to reduce or inhibit side-etching due to bimetallic corrosion which occurs when a laminated film composed of W-based metal film and a metal having lower ionization tendency than that of tungsten is processed.

INDUSTRIAL APPLICABILITY

Among the etching agents of the present invention, by selectively etching a Ti-based metal film on a semiconductor substrate, in particular, on a substrate provided with Cu wiring, using the etching agent for semiconductor substrates composed of a solution comprising (A) hydrogen peroxide, (B) a phosphonic acid chelating agent, (c-1) an inorganic alkali, and (D-1) a copper anticorrosive, that is, the etching agent relevant to the present invention <1>, the following effects can be exhibited: for example, corrosion of an underlying metal or a metal on a substrate can be inhibited; lifetime of the etching agent can be prolonged because amount of metal dissolved into the etching agent is reduced; etching can be carried out without generating residue due to improved ratio of etching selectivity for a Ti-based metal film; and the like, as compared with the conventional methods.

Among the etching agents of the present invention, by etching a W-based metal film on a semiconductor substrate provided with a metal bump or a metal wiring having lower ionization tendency than that of tungsten (low ionization tendency metal) such as, for example, gold (Au), silver (Ag), palladium (Pd), tin (Sb), or alloy thereof, using the etching agent for a semiconductor substrate composed of a solution comprising (A) hydrogen peroxide, (B) a phosphonic acid chelating agent having a hydroxyl group, (C) a basic compound, and (D-2) 0.01 to 3% by weight of two or more kinds of anion species other than phosphonic acid chelating agents having a hydroxyl group, in which anion species have no oxidizing power, that is, the etching agent relevant to the present invention <2>, the following effects can be exhibited: bimetallic corrosion (Galvanic corrosion) by a W-based metal and the above-described metal having lower ionization tendency than that of tungsten can be inhibited; consequently side-etching caused by relevant corrosion can be inhibited; and the like.

What is claimed is:

1. An etching agent for a semiconductor substrate composed of a solution comprising at least the following (A), (B) (C), and (D-2):
   (A) hydrogen peroxide;
   (B) a phosphonic acid chelating agent having a hydroxyl group;
   (C) a basic compound; and
   (D-2) 0.01 to 3% by weight of two or more kinds of anion species other than phosphonic acid chelating agents having a hydroxyl group, in which anion species have no oxidizing power;
   wherein a pH of the etching agent is 7 to 10.

2. The etching agent according to claim 1, wherein the semiconductor substrate is the one on which a metal bump or a metal wiring having lower ionization tendency than that of tungsten has been formed.

3. The etching agent according to claim 2, wherein the metal bump or metal wiring having lower ionization tendency than that of tungsten is composed of gold, silver, palladium, tin or an alloy thereof.

4. The etching agent according to claim 2, wherein the semiconductor substrate on which metal bump or metal wiring having lower ionization tendency than that of tungsten has been formed is a semiconductor substrate in which relevant metal bump or metal wiring has been formed on the upper part of a tungsten (W)-based metal film.

5. The etching agent according to claim 4, wherein the metal bump or metal wiring having lower ionization tendency than that of tungsten is a metal bump, and a copper wiring has been formed between relevant metal bump and the W-based metal film.

6. The etching agent according to claim 4, wherein the W-based metal film is a titanium-tungsten (TiW) alloy film.

7. The etching agent according to claim 1, wherein the pH of the solution is 7 to 8.5.

8. The etching agent according to claim 1, wherein the (B) phosphonic acid chelating agent having a hydroxyl group is the one of at least one or more kinds selected from 1-hydroxyethylidene-1,1'-diphosphonic acid, 1-hydroxypropylidene-1,1'-diphosphonic acid, and 1-hydroxybutylidene-1,1'-diphosphonic acid.

9. The etching agent according to claim 1, wherein the (C) basic compound is at least one kind selected from the group consisting of inorganic alkalis and organic amines.

10. The etching agent according to claim 1, wherein the (C) basic compound is either a sodium hydroxide or a tetramethylammonium hydroxide.

11. The etching agent according to claim 1, wherein (D-2) is a combination of
    0.0001 to 0.5% by weight of at least one kind of anion species derived from an inorganic acid; and
    0.0099 to 2.5% by weight of at least one kind of anion species derived from an organic acid;
    wherein the anion species derived from the inorganic acid is selected from the group consisting of a sulfate ion, a sulfite ion, a chloride ion, a phosphate ion, a phosphite ion and a hypophosphite ion; and the anion species derived from the organic acid is selected from a citrate ion or a malate ion.

12. The etching agent according to claim 1, wherein (D-2) is a combination of
    0.0001 to 0.5% by weight of at least one kind of anion species derived from an inorganic acid; and
    0.0099 to 2.5% by weight of at least one kind of anion species derived from an organic acid;
    wherein the anion species derived from the inorganic acid is selected from the group consisting of a sulfate ion, a sulfite ion, a chloride ion, and a phosphate ion; and
    the anion species derived from the organic acid is selected from a citrate ion or a malate ion.

13. The etching agent according to claim 1, wherein (D-2) is a combination of
    0.0001 to 0.5% by weight of any one kind of a first anion species derived from an organic acid selected from the group consisting of a carbonate ion, an acetate ion, a citrate ion and a malate ion; and
    0.0099 to 2.5% by weight of an anion species derived from an organic acid selected from a citrate ion or a malate ion other than the first anion species above.

14. The etching agent according to claim 1, wherein (D-2) is a combination of
    0.0001 to 0.5% by weight of at least one kind of anion species derived from an inorganic acid; and
    0.0099 to 2.5% by weight of at least one kind of anion species derived from an inorganic acid;
    wherein the anion species derived from the organic acid is selected from the group consisting of a sulfate ion, a sulfite ion, and a chloride ion; and
    the anion species derived from the inorganic acid is selected from a group consisting of a phosphate ion, a phosphite ion and a hypophosphite ion.

15. The etching agent according to claim 1, wherein
    (A) is 10 to 35% by weight of hydrogen peroxide,
    (B) is 0.1 to 3% by weight of the phosphonic acid chelating agent having a hydroxyl group, and
    (C) is 0.1 to 5% by weight of the basic compound.

16. The etching agent according to claim 1, prepared from a solution comprising hydrogen peroxide and a liquid for preparing etching agent composed of a solution comprising the phosphonic acid chelating agent having a hydroxyl group, the basic compound and two or more kinds of anion species other than phosphonic acid chelating agents having a hydroxyl group, in which anion species have no oxidizing power.

17. An etching method, characterized by etching a W-based metal film on a semiconductor substrate using the etching agent according to claim 1.

18. The etching method according to claim 17, wherein the etching agent is prepared by mixing a solution comprising hydrogen peroxide and a liquid for preparing etching agent composed of a solution comprising a phosphonic acid chelating agent having a hydroxyl group, a basic compound and two or more kinds of anion species other than phosphonic acid chelating agents having a hydroxyl group, which anionic species have no oxidizing power.

19. The etching method according to claim 18, wherein mixing ratio of the solution comprising hydrogen peroxide and the liquid for preparing the etching agent is 30:70 to 99:1.

20. The etching agent according to claim 1, wherein the phosphonic acid chelating agent having a hydroxyl group is a phosphonic acid chelating agent having a hydroxyl group and having no nitrogen atom.

21. The etching agent according to claim 1, wherein one anion species is selected from the group consisting of a carbonate ion, a monocarboxylate ion, a hydroxytricarboxylate ion or a hydroxylcarboxylate ion.

22. The etching agent according to claim 1, wherein the pH of the etching agent is 7 to 9.

23. A liquid for preparing an etching agent for a semiconductor substrate composed of a solution comprising at least the following (B), (C), and (D-2):
    (B) a phosphonic acid chelating agent having a hydroxyl group;
    (C) a basic compound; and
    (D-2) two or more kinds of anion species other than phosphonic acid chelating agents having a hydroxyl group, in which anion species have no oxidizing power;
    wherein a pH of the liquid is adjusted so that a final pH of the etching agent after mixing with a solution comprising hydrogen peroxide falls in a range of 7 to 10.

24. The liquid for preparing the etching agent according to claim 23, wherein a mixing ratio of the solution comprising hydrogen peroxide and the liquid is 30:70 to 99:1.

25. The liquid for preparing the etching agent according to claim 23, wherein the pH of the liquid is adjusted so that the final pH of the etching agent after mixing with the solution comprising hydrogen peroxide falls in a range of 7 to 8.5.

26. The liquid for preparing the etching agent according to claim 23, to be used for preparing the etching agent,
    wherein after mixing with the solution comprising hydrogen peroxide, the final etching agent has concentrations of
    (A) 10 to 35% by weight of hydrogen peroxide,
    (B) 0.1 to 3% by weight of the phosphonic acid chelating agent having a hydroxyl group,
    (C) 0.1 to 5% by weight of the inorganic alkali, and
    (D-2) 0.01 to 3% by weight of two or more kinds of anion species other than phosphonic acid chelating agents having a hydroxyl group, in which anion species have no oxidizing power.

27. The liquid for preparing the etching agent according to claim 23, wherein the pH of the liquid is adjusted so that the final pH of the etching agent after mixing with the solution comprising hydrogen peroxide falls in a range of 7 to 9.

* * * * *

UNITED STATES PATENT AND TRADEMARK OFFICE
CERTIFICATE OF CORRECTION

PATENT NO.       : 8,513,139 B2
APPLICATION NO.  : 12/808903
DATED            : August 20, 2013
INVENTOR(S)      : Osamu Matsuda et al.

It is certified that error appears in the above-identified patent and that said Letters Patent is hereby corrected as shown below:

On the Title page: Item (73):
Change

"(73)   Assignee:   Wako Pure Chemical Industrials, Ltd.,
                    Chuo-Ku, Tokyo (JP)"

To be

--(73)  Assignee:   Wako Pure Chemical Industrials, Ltd.,
                    Osaka-shi, Osaka (JP)--

Signed and Sealed this
Eleventh Day of March, 2014

Michelle K. Lee
*Deputy Director of the United States Patent and Trademark Office*